US006320471B1

(12) United States Patent
Peter et al.

(10) Patent No.: US 6,320,471 B1
(45) Date of Patent: Nov. 20, 2001

(54) METHOD AND DEVICE FOR COMPUTER SUPPORTED DETERMINATION OF AN OSCILLATING REGION OF AN ELECTRICAL CIRCUIT

(75) Inventors: Jürgen Peter, Zorneding; Rolf Neubert, Unterhaching, both of (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/555,204

(22) PCT Filed: Jul. 9, 1998

(86) PCT No.: PCT/EP98/05600

§ 371 Date: May 25, 2000

§ 102(e) Date: May 25, 2000

(87) PCT Pub. No.: WO99/28839

PCT Pub. Date: Jun. 10, 1999

(30) Foreign Application Priority Data

Nov. 27, 1997 (DE) .............................. 197 52 606

(51) Int. Cl.[7] .............. G06F 17/50; H03B 5/02
(52) U.S. Cl. .............. 331/44; 331/158; 324/76.49; 324/76.51; 324/727; 702/75
(58) Field of Search ................ 331/44, 116 R, 331/116 FE, 158; 324/76.49, 76.51, 727; 702/75, 76

(56) References Cited

U.S. PATENT DOCUMENTS 5,444,641 * 8/1995 White ........................ 702/65
5,787,004 * 7/1998 Schmidt-Kreusel et al. .......... 702/75

FOREIGN PATENT DOCUMENTS 44 11 765 A1 10/1995 (DE) .

0 785 619 A2 7/1997 (EP) .

OTHER PUBLICATIONS

Durbin et al., "Une nouvelle démarche pour l'optimisation des circuits intégrés: Association de la méthode du recuit simulé au simulateur ouvert Spice–Pac", L'Onde Electrique, 1990 pp. 59–65.
Feldmann et al., "Algorithms for Modern Circuit Simulation", vol. 46, No. 4, pp. 274–285. 1992.
Neubert, "Predictor–Corrector Techniques for Detecting Hopf Bifurcation Points", International Journal of Bifurcation and Chaos, vol. 3, No. 5, 1993 pp. 1311–1318.
Zheng, "Hopf Bifurcation in Differential Algebraic Equations and Applications to Circuit Simulation", International Series of Numerical Mathematics, vol. 93, 1990, pp. 45–58.
Seydel, "Numerical Computation of Periodic Orbits That Bifurcate from Stationary Solutions of Ordinary Differential Equations", Technische Universität München, 1981, pp. 1–43.
Chua et al., "Linear and Nonlinear Circuits", 1987, pp. 644–687. McGraw Hill.
Neubert, "An Effective Method for the Stability Analysis of Steady States in the Simulation of Large Electrical Networks", 2.ITG Discussion Panel, Mathis et al. (Ed), VDE, Berlin, Apr. 1995, ISBN 3–8007–2190–2, pp. 41–48.*

* cited by examiner

Primary Examiner—Siegfried H. Grimm

(57) ABSTRACT

An electrical circuit having an oscillator and additional structural elements that are connected to the oscillator. In an iterative method, upon variation of circuit parameters of the additional structural elements, the following steps are carried out for each instance of the circuit parameters: a stability analysis of the circuit is carried out for each respective instance, and if the circuit oscillates, a first value is assigned to the instance in a matrix in which all the instances being examined are stored. Otherwise, a second value is assigned to the instance in the matrix.

10 Claims, 3 Drawing Sheets

METHOD AND DEVICE FOR COMPUTER SUPPORTED DETERMINATION OF AN OSCILLATING REGION OF AN ELECTRICAL CIRCUIT

BACKGROUND OF THE INVENTION

The present invention is related to the determination of an oscillating region of an electrical circuit.

In an integrated digital semiconductor circuit, an oscillator is sometimes used to generate the internal operational clock. An oscillator in the context of this document may be a quartz oscillator or a ceramic oscillator, in particular.

An oscillator circuit that comprises at least one oscillator is subject to the following requirements:
1. The oscillator circuit should definitely oscillate within a defined time period, and the oscillation may not break off precipitously.
2. The frequency of the oscillator circuit should vary only within a predeterminable range.
3. The current flowing through the oscillator may not exceed a predeterminable value, in order to avoid destruction or undesirable changes in the behavior of the oscillator.

To guarantee these requirements, it is known to provide additional structural elements in an oscillator circuit in addition to the oscillator. Electrical resistors, electrical capacitors, electrical inductors, amplification modules, and so on, are possible additional structural elements.

The additional structural elements cannot always be integrated into the semiconductor circuit. The correct dimensioning of the additional elements presents a significant problem. On one hand, it must be determined whether or not an oscillator circuit is able to oscillate in the first place, and on the other hand, a dimensioning of the additional structural elements must be calculated so as to guarantee a definite oscillation.

It is known to solve this problem exclusively on the basis of measuring technology. To this end, an integrated circuit is built with the oscillator and the required additional structural elements. The circuit is then checked metrologically as to whether it satisfies the desired behavior with respect to the reliability of oscillation, frequency constancy, and maximum current load of the oscillator.

To calculate a favorable dimensioning of the additional structural elements, the circuits must be built using the different respective structural element values, and the measurements must be respectively checked. In the known method, the structural element values and the information about whether or not the circuit with the respective dimensions of the additional structural elements oscillates are kept in a matrix, from which the favorable dimensions for the additional structural elements are computed.

This procedure has inherent disadvantages:
1. The known method is time-consuming, since the exchanging of the structural elements, which need to be varied, and the corresponding measurements cannot be automated.
2. The measurement results are imprecise, since production tolerances in the production of the integrated circuits or in the oscillator cannot be taken into account. It is therefore impossible to consider the results in view of the differing qualities of the structural elements.
3. Only upon exertion of very demanding and cost-intensive efforts is it possible at all to create various operating conditions, such as a very high or very low temperature, under which the electrical circuit must operate.

This leads to a very inexact and intensive determination of the structural element values and only to unreliable statements concerning the oscillation certainty for a predetermined dimensioning of the additional structural elements.

L. O. Chua et al., "Linear and Nonlinear Circuits", McGraw Hill, New York, 1987, ISBN 0-07-010898-6, pp. 644–687, teaches a method for analyzing the stability of an electrical circuit.

R. Neubert, "An Effective Method for the Stability Analyses of Steady States in the Simulation of Large Electrical Networks", 2.ITG Discussion Panel, Neue Anwendungen theoretischer Konzepte in der Elecktrotechnik, W. Mathis et al. (Ed.), VDE, Berlin, April 1995, ISBN 3-8007-2190-2, pp. 41–48; Q. Zheg, "Hopf Bifurcation in Differential Algebraic Equations and Applications to Circuit Simulation", International Series of Numerical Mathematics, Vol. 93, Birkhäuser Verlag Basel, 1989, ISBN 0-9176-2439-2, pp. 45–48; and R. Neubert, "Predictor-Corrector Techniques for Detecting Hopf Bifurcation Point", International Journal of Bifurcation and Chaos, Vol. 3, No. 5, 1993, World Scientific Company, ISSN 0218–1274, pp. 1311–1318, describe methods for determining a Hopf bifurcation point. A Hopf bifurcation point is a point on a DC curve at which a change of the examined electrical circuit takes place with respect to its stability behavior; that is, the point at which the circuit changes from a stable, stationary state into an oscillating state.

European Patent Application No. 0 785 619 teaches a method for computer supported iterative determination of the transient behavior of a quartz oscillator circuit. A dynamic equilibrium is calculated and a transient analysis is performed, in alternation, for a current source which substitutes for the quartz oscillator, for a calculated, predeterminable working point. The transient analysis is accomplished for the circuit with a resubstituted quartz oscillator circuit.

It is also taught in U. Feldmann et al., "Algorithms for Modern Circuit Simulation", AEU, Hirzel, Stuttgart, Vol. 46, No. 4, 1992, ISSN 0001-1096, pp. 274–285, to acquire a periodic status description of the technical system starting from a qualitatively high-value starting solution.

Furthermore, what are known as tracking methods are known from T2/T1 Seydel, "Numerical Computation of Periodic Orbits that Bifurcate from Stationary Solutions of Ordinary Differential Equations", Technische Universität München, Institut für Mathematik, TUM-MATH-12-81-M12-250/1-FMA: 1–43, 1981, by which it is possible to acquire additional periodic solutions for describing the circuit from a periodic state description in order to thereby calculate a periodic solution of the circuit at a predeterminable working point. Tracking methods are also referred to as predictor-corrector methods.

German Patent Application No. 44 11 765 teaches a method for designing oscillators with minimized noise. In this method, a linear subnetwork—for instance containing geometric data of the layout, values of passive electronic components (capacitors, inductors, resistors) or parameters of an active element of the oscillator (e.g. parameters of the transistor)—is calculated such that the phase noise is minimal. To this end, the signal-to-noise ratio of the oscillator is described by differential equations. On the corollary condition that the differential equations for the signal behavior are satisfied, a single sideband phase noise of the oscillator is optimized using direct methods of optimal control.

SUMMARY OF THE INVENTION

It is an object of the present invention to indicate, in a computer supported manner, an oscillating region of an electrical circuit comprising at least one quartz oscillator and additional structural elements that are connected to the quartz oscillator, while avoiding the above described disadvantages of the prior art.

This object is inventively achieved in accordance with the present invention in a method for determining an oscillating region of an electrical circuit comprising at least one oscillator and additional structural elements connected to the oscillator, the method comprising the steps of:

in a computing device, executing, in an iterative method, upon variation of combinations of circuit parameters of the additional structural elements, the following steps for each instance of the circuit parameters:

performing a stability analysis of said electrical circuit for a respective instance for determining whether said instance oscillates;

if the analyzed instance oscillates, assigning said instance a first value in a matrix in which all parameter combinations being analyzed are stored, said first value indicating that said instance oscillates;

if the analyzed instance does not oscillate, assigning said instance a second value in the matrix, said second value indicating that said instance does not oscillate; and deriving the oscillating region from said parameter combinations that have been assigned said first value in said matrix.

This object is also inventively achieved in accordance with the present invention in a device for computer assisted determination of an oscillating region of an electrical circuit comprising at least one oscillator and additional structural elements connected to said oscillator, said device comprising:

a computing device having a processing unit configured for executing, in an iterative method, upon variation of combinations of circuit parameters of said additional structural elements, the following steps for each instance of said circuit parameters:

performing a stability analysis of said electrical circuit for a respective instance for determining whether said instance oscillates;

if said analyzed instance oscillates, assigning said instance a first value in a matrix in which all parameter combinations being analyzed are stored, said first value indicating that said instance oscillates;

if said analyzed instance does not oscillate, assigning said instance a second value in said matrix, said second value indicating that said instance does not oscillate; and deriving said oscillating region from said parameter combinations that have been assigned said first value in said matrix.

In the present method, the following steps are iteratively executed for each instance of the circuit parameters of the additional structural elements, with variation of said parameters:

execution of a stability analysis of the circuit for each respective instance;

if the instance is determined to oscillate, the instance is assigned a first value in a matrix, which first value indicates that the instance of the circuit oscillates. All examined instances are stored in the matrix. If it is determined that the instance does not oscillate, then the instance is assigned a second value in the matrix, which value indicates that the instance does not oscillate; and the oscillating region derives from the instances which were assigned the first value in the matrix.

The present device comprises a processor unit, which is configured such that the following steps are iteratively performed for each respective instance of the circuit parameters of the additional structural elements, with variation of said parameters. A stability analysis of the circuit is performed for the respective instance. If it is determined that the instance of the circuit oscillates, the instance is assigned a first value in a matrix which indicates that the instance oscillates. All examined instances are stored in the matrix. If it is determined that the instance of the circuit does not oscillate, then the instance is assigned a second value in the matrix, which indicates the instance of the circuit does not oscillate. The oscillating region derives from the instances which were assigned the first value in the matrix.

An instance should be understood as a respective oscillator circuit having particular dimensions of the additional structural elements and/or particular temperature conditions, operating conditions and/or particular tolerances of the additional structural elements.

In the first place, the present invention lays out a very simple, automated calculation of an oscillating region for an oscillator circuit. Second, the present invention makes it possible to take into account structural elements of varying quality with different tolerance values. Extreme operating conditions can also be accounted for in the scope of the present inventive circuit simulation.

In an embodiment, the oscillator can be a quartz oscillator or a ceramic oscillator.

In an embodiment, the additional structural elements can be electrical resistors, capacitors, inductors, amplifier elements, and so on.

The stability analysis of the electrical circuit can be accomplished by different methods. It has proven advantageous to perform the stability analysis upon determining a Hopf bifurcation point for the respective instance. This method of stability analysis is extremely simple and thus saves computing time.

In other embodiments, other possible stability analyses are (at the same time as a DC transfer analysis):

pole-zero analysis,

AC analysis (small signal analysis) using the Bode criterion or the Nyquist criterion transient analysis.

For part of the instances, the oscillating state or the dynamic equilibrium of the instance at a predeterminable working point can be computed in accordance with one of the methods described in R. Neubert, "An Effective Method for the Stability Analyses of Steady States in the Simulation of Large Electrical Networks", 2.ITG Discussion Panel, Neue Anwendungen theoretischer Konzepte in der Elecktrotechnik, W. Mathis et al. (Ed.), VDE, Berlin, April 1995, ISBN 3-8007-2190-2, pp. 41–48; Q. Zheg, "Hopf Bifurcation in Differential Algebraic Equations and Applications to Circuit Simulation", International Series of Numerical Mathematics, Vol. 93, Birkhäuser Verlag Basel, 1989, ISBN 0-9176-2439-2, pp. 45–48; or R. Neubert, "Predictor-Corrector Techniques for Detecting Hopf Bifurcation Point", International Journal of Bifurcation and Chaos, Vol. 3, No. 5, 1993, World Scientific Company, ISSN 0218-1274, pp. 1311–1318. On the basis of this embodiment, the instance is also examined as to whether the circuit continues to oscillate at the predetermined working point. It is thus also possible to guarantee certain continuing oscillation of the circuit for the respective instance.

In a further embodiment of the invention, it is provided that, for at least part of the instances, the respective transient behavior is determined. The advantage of this is that, following the successful determination of the transient behavior, all relevant information is known for the instance with the respective dimensioning. Thus, all desired information about the circuit is available.

These and other features of the invention(s) will become clearer with reference to the following detailed description of the presently preferred embodiments and accompanied drawings.

DETAILED DESCRIPTION OF THE PRESENTLY PREFERRED EMBODIMENTS

Figure 2:
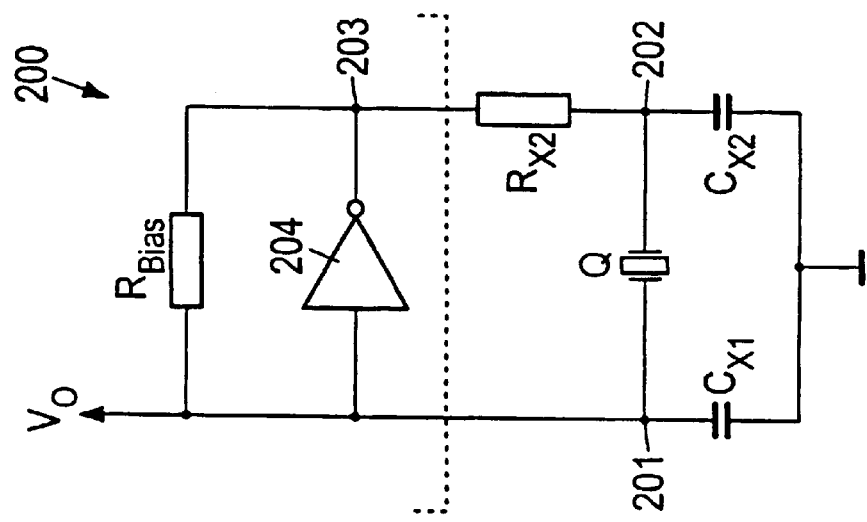
FIG. 2 is a schematic block diagram of an electrical circuit for which the matrix in FIG. 1 was computed.

FIG. 2 shows an oscillator Q which is connected with a first terminal 201 to a supply voltage $V_0$, on one hand, and to a first capacitor $C_{x1}$, on the other hand. The first capacitor $C_{x1}$ is additionally connected to earth and to a second capacitor $C_{x2}$. The second capacitor $C_{x2}$ is connected via a second terminal 202 to the oscillator Q and to an electrical resistor $R_{X2}$. The second resistance $R_{X2}$ is connected via a third terminal 203 to an output of an inverter 204 and of a series resistor $R_{bias}$, and these two components are connected on their part to the supply voltage $V_0$ via the first terminal 201.

It is necessary to calculate the oscillating region with the pertaining dimensions (instances) of the additional structural elements (first capacitor $C_{X1}$, second capacitor $C_{X2}$ and electrical resistor $R_{X2}$) for the oscillator circuit 200.

To calculate the oscillating region of the oscillator circuit 200, the following iterative method is executed for different instances of the oscillator circuit 200.

In each iteration step, one instance is defined; i.e., one dimensioning or one stipulation of the additional structural elements and their frame conditions (operating conditions, tolerances of the elements).

Figure 1:
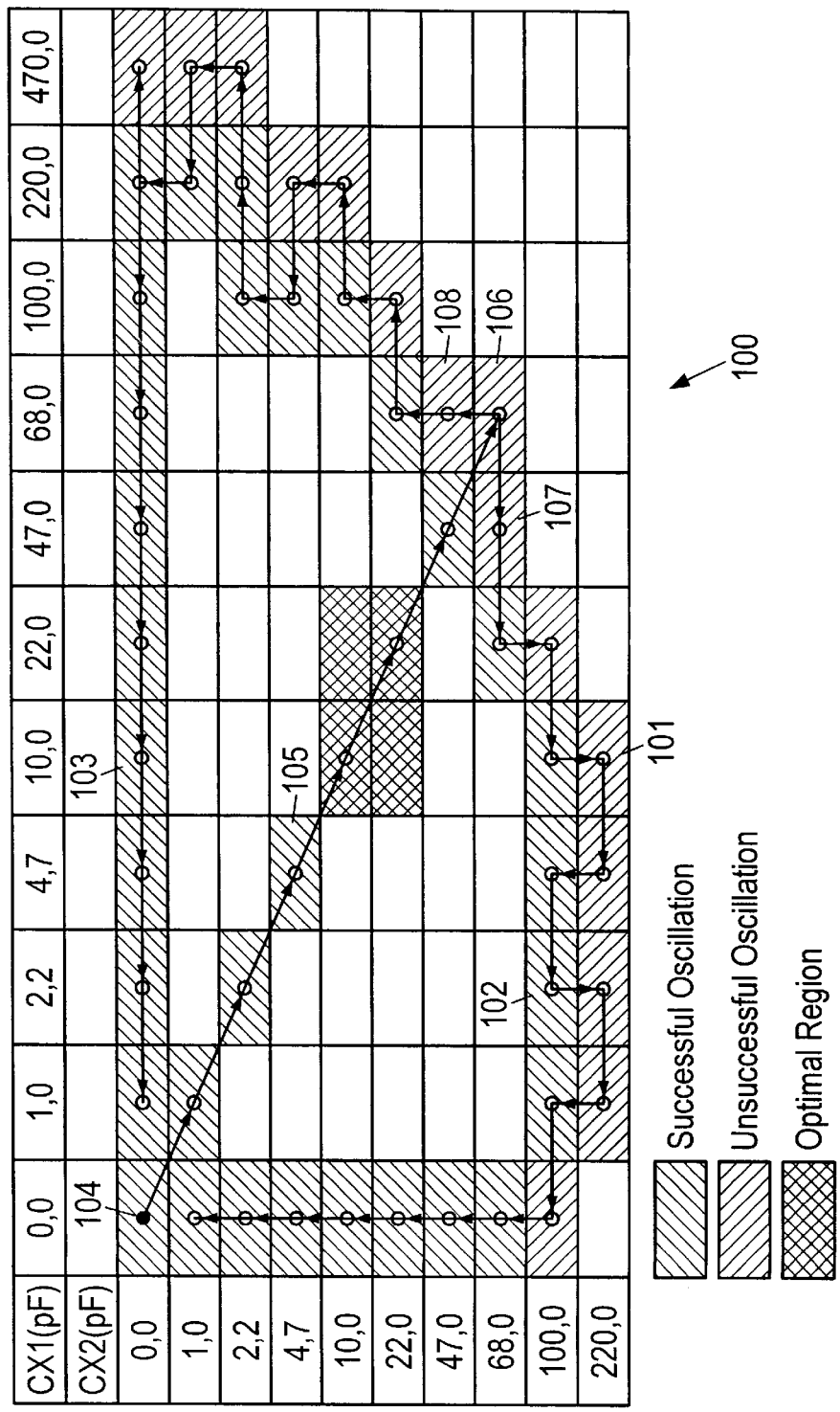
FIG. 1 shows a two-dimensional matrix in which the oscillating region of an electrical circuit is illustrated for various dimensionings of two capacitors.

In this exemplifying embodiment, for the sake of a simpler view, the method is shown with a fixed electrical resistor $R_{X2}$ and defined frame conditions; that is, the first capacitor $C_{X1}$ and the second capacitor $C_{X2}$ are each varied in a predeterminable dimensioning interval, which is represented in a column of a table represented in FIG. 1 for the second capacitor $C_{X2}$ in picofarad (pF) and in a second row for the first capacitor $C_{X1}$ in pF. For each instance, a stability analysis of the oscillator circuit 200 is performed.

Figure 3:
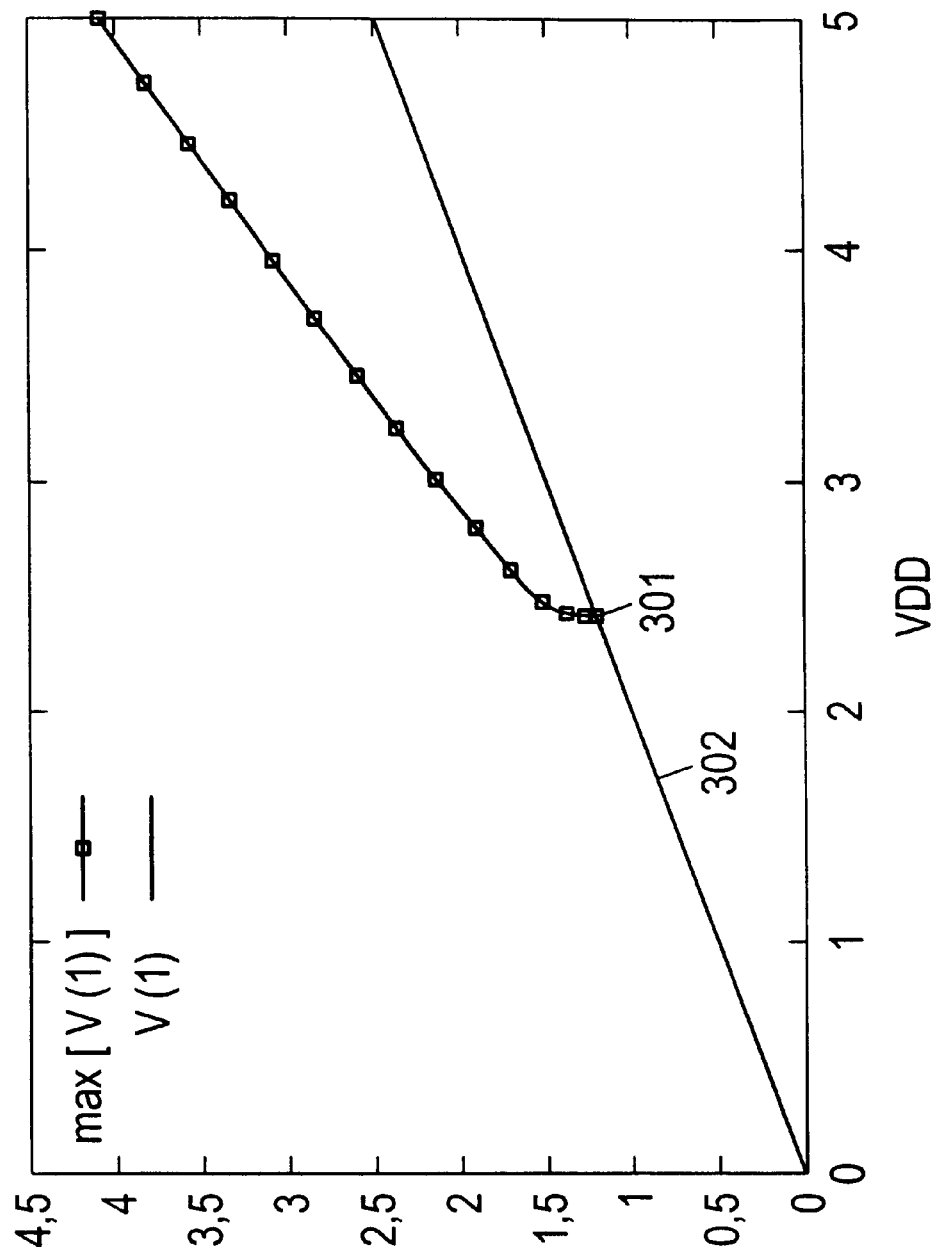
FIG. 3 is a bifurcation diagram of an oscillator circuit.

This is accomplished by computing the Hopf bifurcation point 301 (cf. FIG. 3). A Hopf bifurcation point 301 is a point of an electrical circuit at which the electrical circuit switches over from a stable state into an unstable, that is oscillating, state.

The Hopf bifurcation point 301 is determined in accordance with one of the methods described in "An Effective Method for the Stability Analyses of Steady States in the Simulation of Large Electrical Networks", 2.ITG Discussion Panel, Neue Anwendungen theoretischer Konzepte in der Elecktrotechnik, W. Mathis et al. (Ed.), VDE, Berlin, April 1995, ISBN 3-8007-2190-2, pp. 41–48; Q. Zheg, "Hopf Bifurcation in Differential Algebraic Equations and Applications to Circuit Simulation", International Series of Numerical Mathematics, Vol. 93, Birkhäuser Verlag Basel, 1989, ISBN 0-9176-2439-2, pp. 45–48; or R. Neubert, "Predictor-Corrector Techniques for Detecting Hopf Bifurcation Point", International Journal of Bifurcation and Chaos, Vol. 3, No. 5, 1993, World Scientific Company, ISSN 0218-1274, pp. 1311–1318.

In addition, in accordance with the method described below, a predeterminable working point is also checked as to whether the electrical circuit oscillates stably at the working point as well.

The Hopf bifuircation point HP is described by a triplet which comprises an eigenvalue $\mu_0$, whose imaginary part is also designated the eigenfrequency of the circuit, a neutral position $y_0$ of the Hopf bifurcation point HP, and an eigenvector $v_0$.

The Hopf bifurcation point HP is thus defined by the following triplet:

$$HP=(\mu_0, y_0, v_0):=(\mu(\lambda_0), y(\lambda_0), v(\lambda_0)) \tag{1}$$

$\lambda_0$ designates the system parameter $\lambda$ for which the Hopf bifurcation point HP is being obtained for the circuit. Determination of the bifurcation planes $\pi_\lambda$ for the respective system parameter $\lambda$ 102

Proceeding from the Hopf bifurcation point HP, bifurcation planes $\pi_\lambda$ are computed in a subsequent step.

To this end, the eigenvalue $\mu(\lambda)$ and the eigenvector $v(\lambda)$ are computed for the system parameter $\lambda$ and to the corresponding solution $y(\lambda)$ in an environment of the Hopf bifurcation point HP with the corresponding system parameter $(\lambda_0)$.

One possibility for forming the bifurcation planes $\pi_\lambda$ is to use the eigenvectors $v(\lambda)$ to span the bifurcation planes $\pi_\lambda$ in the complex space C with the real portions $\text{Re}\{v(\lambda)\}$ or the imaginary portions $\text{Im}\{v(\lambda)\}$ of the eigenvectors $v(\lambda)$, respectively.

A bifurcation plane $\pi_\lambda$ derives in accordance with the following rule:

$$\pi_\lambda = \{z | z = c \cdot v(\lambda), c \in C\} \tag{2}$$

The bifurcation plane family $\Pi$ derives according to the following rule:

$$\Pi = \{\pi_{80} | \lambda \in \Re\}.$$

Here, a factor c is a random complex number. When real numbers $\Re$ are used, the bifurcation plane $\pi_\lambda$ is two-dimensional; when complex numbers C are used, the bifurcation plane $\pi_\lambda$ is one-dimensional.

It is possible to calculate the periodic state description by utilizing the bifurcation plane $\pi_\lambda$ and thus utilizing a transformation of all the possible state space, in a complex technical system which is described by a higher number of differential algebraic equations, from a very high-dimensional state space for computing the periodic state description to a low-dimensional space of a plane, the bifurcation plane $\pi_\lambda$.

Calculation of the periodic state description

The curve below is a freely prescribable curve which, however, is located in the bifurcation plane family $\Pi$.

In general, for each point along the curve, a periodic state description can be described by the following function:

$$x(t) = c_p v(\lambda) e^{i\omega(\lambda)t} + \bar{C}_p \bar{v}(\bar{\lambda}) e^{-i\omega(\lambda)t} + y(\lambda) \tag{3}$$

where:

$$\omega(\lambda)=Im(\mu(\lambda)).$$

The factor $c_p$ is selected such that $c_p v(\lambda)$ gives the point P.

This general approach to describing a periodic state from the equation (3) is generally not a solution of the differential algebraic system.

This means that the following relation holds:

$$f(\dot{x}(t),x(t),\lambda)\neq 0 \quad (4).$$

To compute a solution and thus a periodic state description along the curve within the bifurcation family Π, it is necessary that the rule (3) lead to a solution of the differential algebraic equation system.

This can be solved in such a way that an additional penalty term F(t) is taken into account, which has the following structure:

$$F(t)=f(\dot{x}(t),x(t),\lambda) \quad (5).$$

This results in the following performance function P(t):

$$P(t)=x(t)^T \cdot f(\dot{x}(t),x(t),\lambda) \quad (6).$$

The variable t respectively designates the time at which the technical system is being described. The variable x can be seen as a current rate of a mechanical dynamic system.

From the performance function P(t), an energy function E(t) can be computed by integrating the performance function P(t) over one period of the respective oscillation:

$$E(\lambda)=x(t)^T \cdot f(\dot{x}(t),x(t),\lambda)dt \quad (7).$$

For a periodic solution of a differential algebraic equation system, the energy function E(t) is totally balanced, since the following rule applies therefor:

$$f(\dot{x}(t),x(t),\lambda)=0 \quad (8).$$

This holds true for all times t.

In other words, this means that a balanced energy function E(t) is a characteristic of a periodic solution of a circuit. This characteristic can be additionally used to determine a point with which it is possible to estimate a good periodic state description of the circuit.

The point is calculated in that, along the curve at freely definable interval steps, the energy function E(λ) for a respective point of the curve is calculated. Since it can be demonstrated that a zero crossing of the real portion of the energy function Re{E(λ)} at the respective evaluated point on the curve yields a very good point with which a very good periodic state description of the circuit can be computed, a zero crossing of the real portion of the energy function Re{E(λ)} of the technical system is calculated.

To calculate the zero crossing of the real portion of the energy function Re{E(λ)}, any method of one-dimensional zero-crossing analysis can be used, which are also referred to as derivative-free zeroing methods.

It is advantageous that the curve is a half-open circular curve about the Hopf bifurcation point.

As a basis for the size of the curve with reference to the Hopf bifurcation point and the eigenvalue $\mu_0$ of the Hopf bifurcation point, the following dimensioning is suggested, this having proven advantageous.

An ellipse about the Hopf bifurcation point has proven advantageous (also as a half-open curve) whose secant along the first solution curve of the stationary solutions is approximately a maximum of 2% of the parameter range being examined, in which the system parameter λ is varied, symmetrically about the Hopf bifurcation point. A value between 0.1 and 1 volt is a suitable height for the ellipse.

For the zero crossing, i.e. for the calculated point on the curve, the periodic state description x(t) pertaining to the point is calculated.

For the periodic state description x(t), a periodic solution of the circuit is calculated, for instance using the procedure described in document U. Feldmann et al., "Algorithms for Modern Circuit Simulation", AEU, Hirzel, Stuttgart, Vol. 46, No. 4, 1992, ISSN 0001-1096, pp. 274–285.

The periodic state description x(t) of the circuit is the periodic solution of the circuit for the system parameter λ.

The periodic state description is used as starting solution for the determination of additional periodic solutions, proceeding from the starting solution, that is, the periodic state description.

Since, with the starting solution, a very good approximation for a solution was computed on the second solution curve in the vicinity of the Hopf bifurcation point, it is now possible to calculate additional periodic solutions of the circuit that are located on the second solution curve by utilizing the tracking methods described in T2/T1 Seydel, "Numerical Computation of Periodic Orbits that Bifurcate from Stationary Solutions of Ordinary Differential Equations", Technische Universität München, Institut für Mathematik, TUM-MATH-12-81-M12-250/1-FMA:1–43, 1981.

This is continued iteratively until a periodic solution has been calculated at a predeterminable working point of the circuit.

The method of harmonic balance, for example, can be employed to calculate the periodic solution for a system parameter λ.

The result of an iteration is whether or not the respective instance of the oscillator circuit 200 oscillates.

If it does, then a second binary value 101 is inserted into the field that is unambiguously defined by the dimensions of the capacitors $C_{x1}$, $C_{x2}$. If the instance does oscillate, however, then a first binary value 102 is assigned to the corresponding field of the matrix 100.

From the resulting oscillating region 103, which is bounded by the respective instances that oscillate, a group of instances is selected, for which the overall transient behavior of the quartz oscillator circuit is calculated.

A method for calculating the transient behavior of a quartz oscillator proceeds in accordance with the method described in Q. Zheg, "Hopf Bifurcation in Differential Algebraic Equations and Applications to Circuit Simulation", International Series of Numerical Mathematics, Vol. 93, Birkhäuser Verlag Basel, 1989, ISBN 0-9176-2439-2, pp. 45–48.

Several alternatives for the above described exemplifying embodiment are demonstrated below.

It is not necessary to examine all instances of the oscillator circuit 200. As represented visually, proceeding from a starting point 104, instances in a diagonal of the 2-dimensional matrix 100 (in a higher-dimensional matrix, corresponding to a space diagonal of the hyperspace described by the higher-dimensional matrix ) the instances are subjected to the stability analysis. In FIG. 1 this procedure is represented by an arrow 105 in the matrix 100. The diagonal is followed until an instance of the circuit does not oscillate. This instance is referenced 106 in the matrix 100.

Starting with the first instance that does not oscillate, analysis is performed along the boundary region of stable and unstable instances, in a step-shaped process whose path in the matrix 100 is represented by an arrow 107 or 108, respectively.

This process corresponds to a sampling of the boundary region, which makes it unnecessary to check a large subregion in the overall matrix 100.

As described above, the dimensionality of the matrix 100 is random. Accordingly, the additional structural elements are also essentially random, and, as described above, a wide variety of parameters can be taken into account in the circuit simulation.

In general, with respect to the oscillating region 103 it is noted that the closer the value of the computed Hopf bifurcation point 301 for the instance is to the supply voltage $V_0$, the more critical a definite oscillating of the oscillator circuit 200 is.

Figure 4:
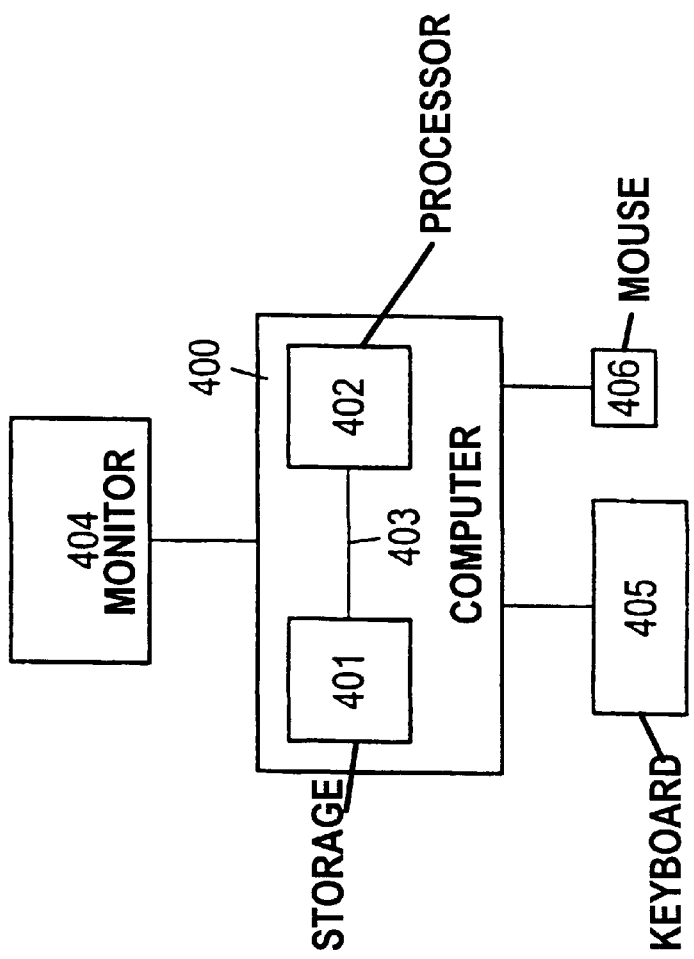
FIG. 4 is a block diagram of a device constructed in accordance with the present invention.

FIG. 4 shows a computer 400 with which the method can be carried out. The computer 400 comprises a storage unit 401, and a processor unit 402, which is connected to the storage unit 401 via a bus 403. In the storage unit 401, a description of the oscillator circuit 200 is stored in a circuit description language, for instance SPICE. The processor unit 402 is configured such that the above described procedural steps for circuit simulation can be executed. A monitor 404 is further provided for displaying the results, and a keyboard 405 and a mouse 406 are provided for inputting information into the computer 400.

Although modifications and changes may be suggested by those of ordinary skill in the art, it is the intention of the inventors to embody within the patent warranted hereon all changes and modifications as reasonably and properly come within the scope of their contribution to the art.

We claim:

1. A method for determining an oscillating region of an electrical circuit comprising at least one oscillator and additional structural elements connected to the oscillator, the method comprising the steps of:

in a computing device, executing, in an iterative method, upon variation of combinations of circuit parameters of the additional structural elements, the following steps for each instance of the circuit parameters:

performing a stability analysis of said electrical circuit for a respective instance for determining whether said instance oscillates;

if the analyzed instance oscillates, assigning said instance a first value in a matrix in which all parameter combinations being analyzed are stored, said first value indicating that said instance oscillates;

if the analyzed instance does not oscillate, assigning said instance a second value in the matrix, said second value indicating that said instance does not oscillate; and deriving the oscillating region from said parameter combinations that have been assigned said first value in said matrix.

2. The method as claimed in claim 1, wherein said stability analysis is performed in accordance with a method selected from the group consisting of:

calculation of a Hopf bifurcation point for the respective instance, pole-zero analysis, AC analysis (small signal analysis) using the Bode criterion or the Nyquist criterion, and transient analysis.

3. The method as claimed in claim 1, wherein said circuit parameters of said additional structural elements comprise at least one of:

different temperatures to which said electrical circuit is exposed, different quality of said additional structural elements, and different dimensioning values of said additional structural elements.

4. The method as claimed in claim 1, wherein, at least for a part of said parameter combinations, said stability analysis is performed at a working point.

5. The method as claimed in claim 4, further comprising the step of:

at least for a part of said parameter combinations, determining a transient behavior of an analyzed instance.

6. A device for computer assisted determination of an oscillating region of an electrical circuit comprising at least one oscillator and additional structural elements connected to said oscillator, said device comprising:

a computing device having a processing unit is configured for executing, in an iterative method, upon variation of combinations of circuit parameters of said additional structural elements, the following steps for each instance of said circuit parameters:

performing a stability analysis of said electrical circuit for a respective instance for determining whether said instance oscillates;

if said analyzed instance oscillates, assigning said instance a first value in a matrix in which all parameter combinations being analyzed are stored, said first value indicating that said instance oscillates;

if said analyzed instance does not oscillate, assigning said instance a second value in said matrix, said second value indicating that said instance does not oscillate; and deriving said oscillating region from said parameter combinations that have been assigned said first value in said matrix.

7. The device as claimed in claim 6, wherein said processing unit is configured for performing said stability analysis in accordance with a method selected from the group consisting of:

calculation of a Hopf bifurcation point for the respective instance, pole-zero analysis, AC analysis (small signal analysis) using the Bode criterion or the Nyquist criterion, and transient analysis.

8. The device as claimed in claim 6, wherein said processing unit is configured such that said circuit parameters of said additional structural elements comprise at least one of:

different temperatures to which said electrical circuit is exposed, different quality of said additional structural elements, and different dimensioning values of said additional structural elements.

9. The device as claimed in claim 6, wherein, said processing unit is configured such that, at least for a part of said parameter combinations, said stability analysis is performed at a working point.

10. The device as claimed in claim 9, wherein said processing unit is configured such that, at least for a part of said parameter combinations, a transient behavior of an analyzed instance is determined.

* * * * *